US006032512A

United States Patent [19]
Li

[11] Patent Number: 6,032,512
[45] Date of Patent: Mar. 7, 2000

[54] WAFER CENTERING DEVICE AND METHOD OF USING

[75] Inventor: Meng Chun Li, Taipei, Taiwan

[73] Assignee: Taiwan Semiconductor Manufacturing Co. Ltd., Hsin-Chu, Taiwan

[21] Appl. No.: 09/088,952

[22] Filed: Jun. 2, 1998

[51] Int. Cl.[7] .................................................. B65G 65/00
[52] U.S. Cl. ................................................................. 73/1.79
[58] Field of Search ................................... 73/1.79, 1.81; 414/935, 936

[56] References Cited

U.S. PATENT DOCUMENTS 4,909,695  3/1990  Hurwitt et al. .
5,851,102  12/1998  Okawa et al. .
5,877,404  3/1999  Fahley .

*Primary Examiner*—Robert Raevis
*Attorney, Agent, or Firm*—Tung & Associates

[57] ABSTRACT

A wafer centering device which includes a wafer centering chuck and a wafer calibration disk and a method for using such device are disclosed. The wafer centering chuck can be advantageously used to replace a vacuum chuck in a processing station that utilizes a rotating wafer platform. A center locating pin provided at the center of the wafer centering chuck can then be used to calibrate a centering position for a liquid dispensing nozzle head which dispenses any type of liquid on a rotating wafer. The wafer calibration disk may be used advantageously to calibrate the motion of a robot arm wafer loader when the disk is used in place of a regular wafer. A center aperture and a calibration grid provided on the wafer calibration disk may be used advantageously to identify the deviation of the center when the calibration disk is placed on a wafer centering chuck by the robotic arm. An edge bead portion provided on a top surface of the wafer calibration disk may further be used to provide calibration for a spray nozzle head used in an edge bead rinsing process. The present invention novel wafer centering chuck and wafer calibration disk can therefore be used either individually, or in combination thereof, for the calibration of a wafer processing machine that utilizes a rotating wafer platform such that a wafer may be positioned on a properly centered vacuum chuck. The present invention novel apparatus and method can be used advantageously to replace conventional apparatus and methods which are both time and labor consuming.

24 Claims, 4 Drawing Sheets

WAFER CENTERING DEVICE AND METHOD OF USING

FIELD OF THE INVENTION

The present invention generally relates to a wafer centering device for centering a wafer processing machine and more particularly, relates to a wafer centering chuck for centering a wafer processing machine that utilizes a wafer rotating platform for receiving a wafer from a robot arm, for accurately performing an edge bead rinse process on a photoresist coated wafer, and for centering a liquid dispensing nozzle to dispense a liquid onto a rotating wafer.

BACKGROUND OF THE INVENTION

In the fabrication process for a semiconductor device, numerous processing steps, i.e., as many as several hundred, must be performed on a semiconducting wafer to form the device. Among the numerous processes, a wafer is frequently positioned on a rotating wafer chuck, or a vacuum chuck, for carrying out the specific process. Among the numerous examples of such processes are the photoresist coating process, the photoresist developing process and an edge bead rinse process for removing excess coating.

In a typical photoresist liquid coating process, a small amount of a photoresist liquid is dispensed onto a wafer that rotates at high speed from a dispense nozzle at the center of the wafer.

Since only a very thin coating of the photoresist material is normally required, the amount of the liquid photoresist material dispensed is small. When a liquid dispense nozzle is not perfectly centered in relation to a rotating wafer, incomplete coverage or even voids on the wafer surface can occur. Such poor coverage of a photoresist coating on a wafer surface results in a high scrap rate of the devices formed on the wafer or even the scrap of the whole wafer.

After the photoresist coating process, a wafer is imaged in a stepper to reproduce circuits desired on the wafer. A liquid developer material is then dispensed onto the surface of the wafer in a technique similar to that used in dispensing the photoresist material. A perfectly centered dispensing nozzle for the developing liquid is crucial to the successful developing of the photoresist layer in order to reproduce the circuits.

After a photoresist material is coated, exposed and developed on the wafer surface, an edge bead rinse (EBR) process is frequently performed before the wafer can be further processed. This is because that, in most processing chambers, a clamp ring is used to hold the wafer down on a platform during a chemical or physical process. A peripheral edge on the top surface of the wafer that will be overlapped by the clamp ring must therefore be cleaned of the photoresist material so that the photoresist material does not crack under the clamp ring and possibly causing serious particulate contamination problems. The edge bead rinse process is an important step that must be carried out after a photoresist coating and developing process.

The wafer processing steps that involve the photoresist coating, developing and edge bead rinsing can be performed in a variety of commercially available process machines. One of such process machine is a WAFER-TRACK® machine 10, shown in FIG. 1, for loading/unloading wafers. A long belt-driven main arm 12 is used to load or unload wafers to and from various processing stations, i.e., a photoresist coating station, a photoresist developer coating station and an edge bead rinse station (not shown). The main arm 12 is driven by belt 14 to and from each of the stations. The main arm 12 is capable of moving in X, Y, Z and θ directions as shown in FIG. 1. An enlarged view of the main arm 12 is shown in FIG. 2. The main arm 12 is constructed by three blades, X1, X2 and X3 to perform the various functions of loading and unloading. In operation, main arm 12 moves by belt 14 to a specific station, one of the blades then swings 90° and extends through a loading slot of the process station to load or unload a wafer. The blades are equipped with an inclined top surface such that a wafer positioned on top may slide off and be positioned on a vacuum chuck.

A typical vacuum chuck employed in a process station is shown in FIGS. 3 and 4. Vacuum chuck 20 consists of a circular-shaped disk 22 having a top surface 24 equipped with vacuum slots 26. The vacuum slots 26 are in fluid communication with a vacuum passage 28 provided in a hollow shaft 30 which is unitarily connected to the center of a bottom surface 18 of the circular-shaped disk 22. The shaft 30 further consists of a hollow end 32 for connecting to a motor shaft 36 for rotational motion.

As shown in FIG. 3, the vacuum chuck 20 may be removed by hand by pulling upward from or installed by pushing downward onto the motor shaft 36. The vacuum chuck 20 shown in FIG. 3 may be employed in any of the processing stations for photoresist coating, developer coating or edge bead rinsing. The vacuum chuck 20 is not equipped with any means for ensuring the proper centering of a wafer positioned on top of the chuck.

In a conventional wafer loading process, as shown in FIG. 4, main arm 12 delivers a wafer 40 into a process station through a loading slot 42. After the wafer 40 is loaded on top of a vacuum chuck (covered by the wafer and not shown in FIG. 4), the main arm 12 withdraws from the loading slot 42. The movement of the main arm 12 is controlled by a process controller through the input of digital signals by a machine operator. The only way for checking whether the wafer has been positioned, or centered, properly on the vacuum chuck is to rotate the wafer 40 by hand. This is shown in FIG. 4. If the wafer is not positioned concentric with the vacuum chuck as shown by an off-centered rotation of the wafer, the machine operator inputs a new set of digital signals into the process controller based solely on his experience. There is no visual reference available to the machine operator for making an objective determination. The process is normally repeated several times before the movement of the main arm in positioning the wafer is properly centered. It is a trial and error process which requires a high skill level on the machine operator. The procedure is therefore both time consuming and highly operator dependent.

In a conventional edge bead rinse process which is conducted in a separate processing station, as shown in FIG. 5, a nozzle assembly 46 controlled by a digital step motor 48 is used to wash the edge bead on a wafer surface. Each bit or pulse by the digital motor 48 causes a displacement of the nozzle head 50 by 0.31 mm. For an 8 inch wafer, a width of 1.62 mm is normally required for edge bead rinse on the outer edge of the wafer.

When a photoresist coated wafer is placed on a vacuum chuck for the edge bead rinse process, the centering of the wafer in relation to the vacuum chuck is very important. Improperly centered wafer results in an unevenly washed wafer edge with one side of the wafer having excessive photoresist coating on top which may result in serious particulate contamination problems in future processing steps. To prevent the uneven wash of a wafer in an edge bead rinse process, a machine operator must provide data inputs to the main arm for positioning the wafer before a correct position can be found. The trial and error process is both labor and time consuming. Moreover, when the centering process is not correctly performed, the yield of the edge bead rinse process will suffer.

FIG. 6 shows a conventional process for dispensing a liquid material, i.e., a photoresist liquid or a developer liquid, onto a wafer surface. A dispensing nozzle 54 is used to dispense a small amount of liquid at the center 56 of wafer 40. The distance between the top surface 58 of wafer 40 and the tip 60 of the dispensing nozzle 54 is kept at a minimum, i.e., approximately 4 mm in order to minimize air bubble or turbulent flow. In a conventional process, after a main arm 12 delivers wafer 40 to the vacuum chuck 20, the machine operator must do trial runs on a few wafers before a correct positioning of the nozzle tip on the wafer can be achieved. This is done by observing the formation of any uneven flow of the liquid on the surface of the wafer, any void formation on the surface or uneven thickness of the photoresist layer formed on top of the wafer. The conventional process of centering a wafer on a vacuum chuck is therefore inadequate and costly for the proper centering of a wafer on a vacuum chuck.

It is therefore an object of the present invention to provide a method and apparatus for centering a wafer processing machine that utilizes a rotating wafer platform that does not have the drawbacks or shortcomings of the conventional methods or apparatus.

It is another object of the present invention to provide a wafer centering device for centering a wafer processing machine utilizing a rotating platform such that the practice of a trial and error method can be eliminated.

It is a further object of the present invention to provide a wafer centering device for centering a wafer processing machine that utilizes a rotating platform for use in conjunction with a wafer loading/unloading robot arm.

It is another further object of the present invention to provide a wafer centering device for centering a wafer processing machine that utilizes a wafer centering chuck equipped with locating pins and a wafer calibration disk equipped with an edge bead portion.

It is still another object of the present invention to provide a wafer centering chuck for centering a wafer processing machine for replacing a conventional vacuum chuck during a calibration procedure such that a visible reference can be provided.

It is yet another object of the present invention to provide a wafer centering chuck for centering a wafer processing machine that is equipped with a center locating pin for calibrating a liquid dispensing nozzle used in processing stations where a photoresist liquid or a developing liquid is dispensed.

It is still another further object of the present invention to provide a wafer calibration disk which is used to calibrate an edge bead rinse nozzle by a built-in edge bead portion provided on the calibration disk.

It is yet another further object of the present invention to provide a wafer calibration disk which can be used in conjunction with a wafer centering chuck for centering a wafer processing machine wherein the calibration disk is formed of a transparent material and equipped with a measuring grid at its center for providing a visible reference.

SUMMARY OF THE INVENTION

In accordance with the present invention, a wafer centering device for centering a wafer processing machine that utilizes a rotating wafer platform and a method for using such device are provided.

In a preferred embodiment, a wafer centering chuck for centering a wafer processing machine is provided which includes a circular disk that has two parallel surfaces of a top surface and a bottom surface, a hollow-centered shaft unitarily connected at one end to a center of the bottom surface of the circular disk and adapted for connecting at the other end to a motor means, and a plurality of pins protruding from the top surface of the circular disk, the plurality of pins including a center locating pin situated at a center of the circular disk and at least three peripheral support pins situated along a periphery of the circular disk which are equally spaced radially from the center locating pin and circumferentially from each other.

The wafer centering chuck may further include a wafer calibration disk which has a shape substantially a wafer, a diameter at least 0.1 mm larger than a wafer which it calibrates, a top surface and a bottom surface, an edge bead portion protruding from the top surface of the calibration disk that has a width substantially similar to a width of a photoresist coating edge bead to be removed from a processed wafer, and an aperture at the center of the wafer calibration disk for alignment with a center locating pin on the wafer centering chuck when the calibration disk is positioned on top of the centering chuck and supported by the at least three peripheral support pins.

The wafer calibration disk is used to calibrate a spray nozzle head for removing a photoresist coating edge bead from the surface of a photoresist coated wafer. The wafer calibration disk may be fabricated of a material that is substantially, optically transparent. The wafer calibration disk may further include a grid pattern at the center aperture for measuring deviations from the center. Each of the plurality of pins protruding from the top surface of the circular disk has a sharp-pointed tip. The plurality of pins may be five pins that include one center pin and four peripheral pins. The wafer centering chuck may be advantageously used to calibrate the centering of a liquid dispensing nozzle for dispensing a liquid on a rotating wafer. Such liquid may include a photoresist liquid, a developer liquid or any other suitable liquids.

The wafer calibration disk is used in calibrating a wafer loading device by loading the calibration disk on the wafer centering chuck and measuring a deviation between the aperture on the calibration disk and the center pin on the centering chuck. The wafer loading device may be a belt-driven wafer loader in a photoresist coating/developing/edge bead rinsing apparatus.

In another preferred embodiment of the present invention, a wafer centering device for centering a wafer processing machine that utilizes a rotating wafer platform is provided which includes a wafer centering chuck that has two parallel surfaces of a top surface and a bottom surface, a hollow-centered shaft unitarily connected at one end to a center of the bottom surface of the centering chuck and adapted for connecting at the other end to a motor means, a plurality of pins protruding from the top surface of the centering chuck, the plurality of pins includes a center pin situated at the center of the centering chuck and at least three peripheral pins situated along a periphery of the centering chuck which are equally spaced radially from the center pin and circumferentially from each other, a wafer calibration disk which has a shape substantially a wafer, a diameter at least 0.1 mm larger than a wafer which it is used to calibrate, a top surface and a bottom surface, an edge bead portion protruding from the top surface of the wafer calibration disk which has a width substantially similar to a width of a photoresist coating edge bead to be removed from a processed wafer, and an aperture at the center of the calibration disk for alignment with the center pin on the centering chuck when the calibration disk is positioned on top of the centering chuck and supported by the at least three peripheral pins.

The wafer calibration disk may be fabricated of a material that is optically transparent, such as glass, quartz or rigid plastics. The wafer calibration disk may further include a grid pattern at the center aperture capable of reading 0.5 mm for measuring deviations from the center. The calibration disk may be advantageously used to calibrate a spray nozzle head for removing a photoresist coating edge bead from the surface of a photoresist coated wafer. The wafer centering chuck can be advantageously used to calibrate the centering of a liquid dispensing nozzle for dispensing a liquid on a rotating wafer. Such liquid includes, but not limited to, a photoresist liquid, a photoresist developing liquid or any other suitable liquids. The wafer calibration disk which is fabricated of a substantially transparent material can be advantageously used to calibrate a wafer loading device by first loading a calibration disk on a wafer centering chuck and then measuring a deviation between the aperture on the calibration disk and the center pin on the centering chuck.

The present invention is further directed to a method for calibrating a wafer loading robot to accurately loading a wafer onto a rotatable wafer platform by the operating steps of providing a wafer centering chuck which has a top surface parallel to a bottom surface, a hollow centered shaft unitarily connected at one end to a center of the bottom surface and adapted for connecting at the other end to a motor means, a plurality of pins protruding from the top surface including a center locating pin at a center of the top surface and at least three support pins along a periphery of the top surface equally spaced from the center locating pin and circumferentially from each other, removing a rotatable wafer platform from a motor drive shaft, mounting the wafer centering chuck to the motor drive shaft, providing a wafer calibration disk that has a wafer shape, a diameter at least 0.1 mm larger than a wafer that it calibrates, a top surface and a bottom surface, an edge bead portion protruding from the top surface of the calibration disk which has a width of at least 0.5 mm, an aperture and a measuring grid at the center of the calibration disk, loading the wafer calibration disk onto the wafer centering chuck by the wafer loading robot such that the disk is supported by the at least three support pins, and measuring a distance between the center locating pin on the wafer centering chuck and the center aperture in the wafer calibration disk by the measuring grid provided on the calibration disk.

The method may further include the steps of providing a width of the edge bead portion on the calibration disk substantially the same as the width of a photoresist coating edge bead on a processed wafer to be removed, and calibrating a spray nozzle head for removing a photoresist coating edge bead to the width of the edge bead portion on the calibration disk. The method may further include the steps of providing a liquid dispensing head and calibrating a center of the liquid dispensing head to the center locating pin on the wafer centering chuck. The wafer loading robot may be a belt-driven wafer loader for a photoresist coating/developing/edge bead rinsing apparatus. The measuring grid provided at the center of the calibration disk may have a dimension of about 0.5 mm/grid.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a wafer centering device for centering a wafer processing machine that utilizes a rotatable wafer platform. The device may include a wafer centering chuck and a wafer calibration disk.

The present invention novel apparatus is illustrated in the environment of a photoresist coating apparatus and a photoresist edge bead rinsing apparatus. However, the present invention novel wafer centering chuck and wafer calibration disk can be utilized in any other wafer processing machines which utilizes a rotatable wafer platform as long as wafer centering is important to the successful performance of the process.

Figure 1:
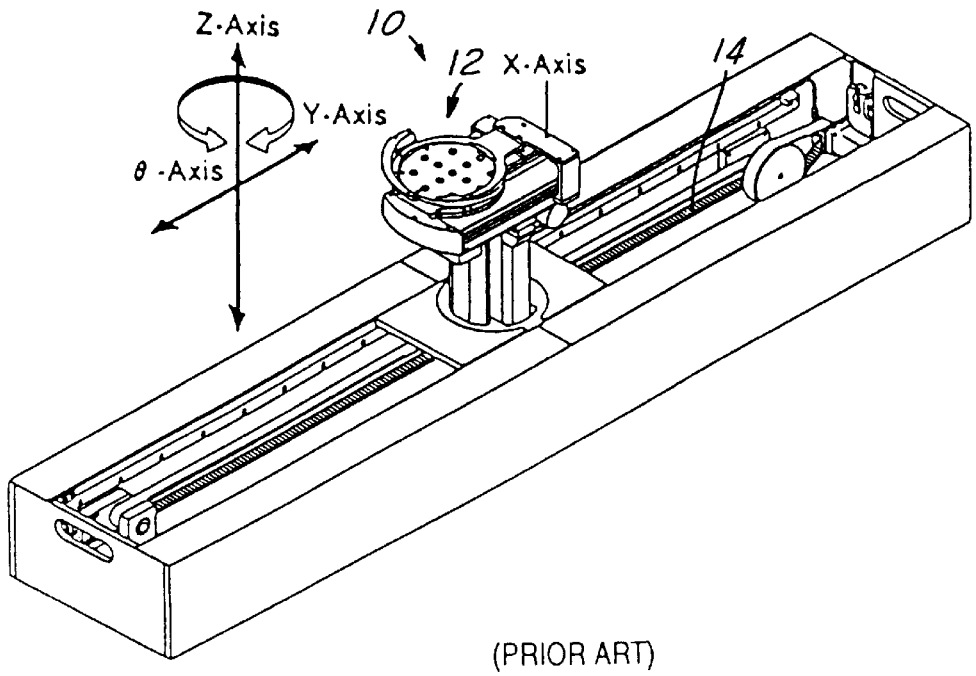
FIG. 1 is a perspective view of a conventional wafer loading/unloading device that travels on a belt.
Figure 2:
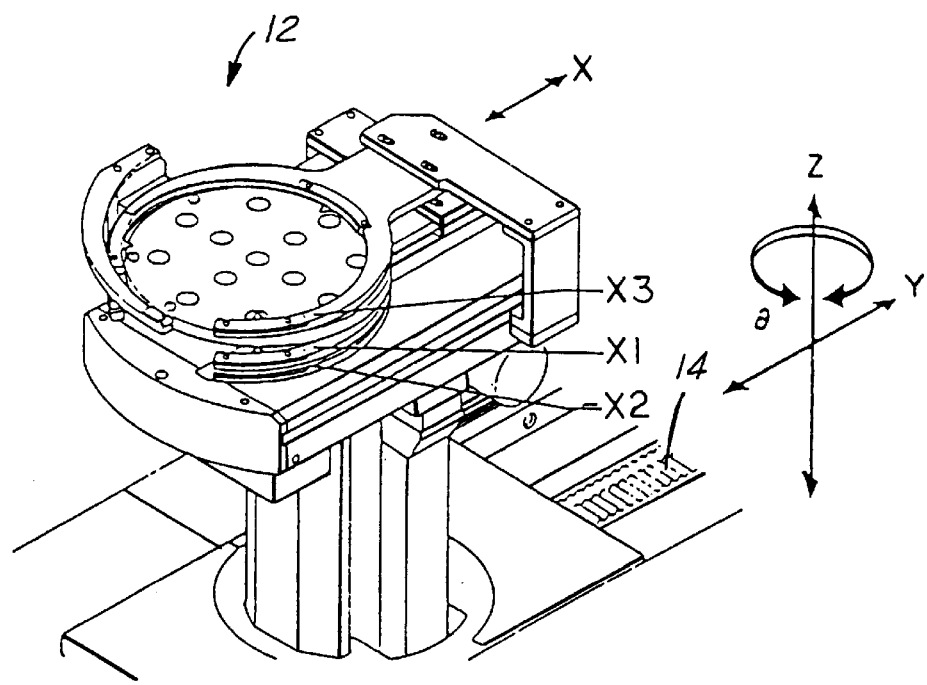
FIG. 2 is a partial, enlarged view of the main arm shown in FIG. 1.
Figure 3:
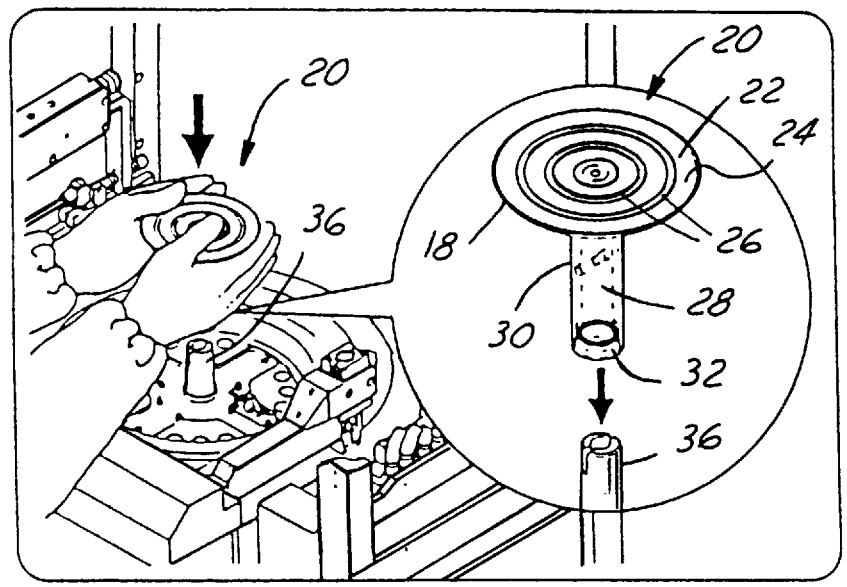
FIG. 3 is a perspective view of a conventional vacuum chuck used in a wafer processing station.
Figure 4:
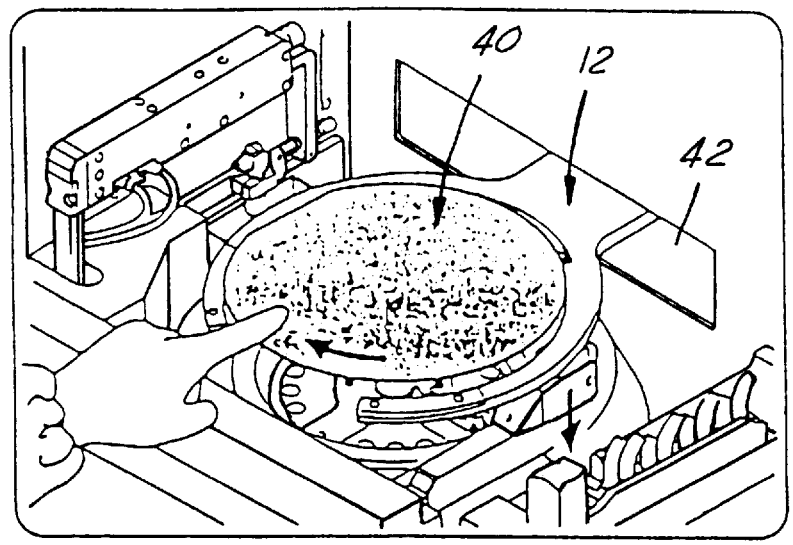
FIG. 4 is an illustration of a conventional method for centering a wafer positioned on a vacuum chuck by manually rotating the wafer.
Figure 5:
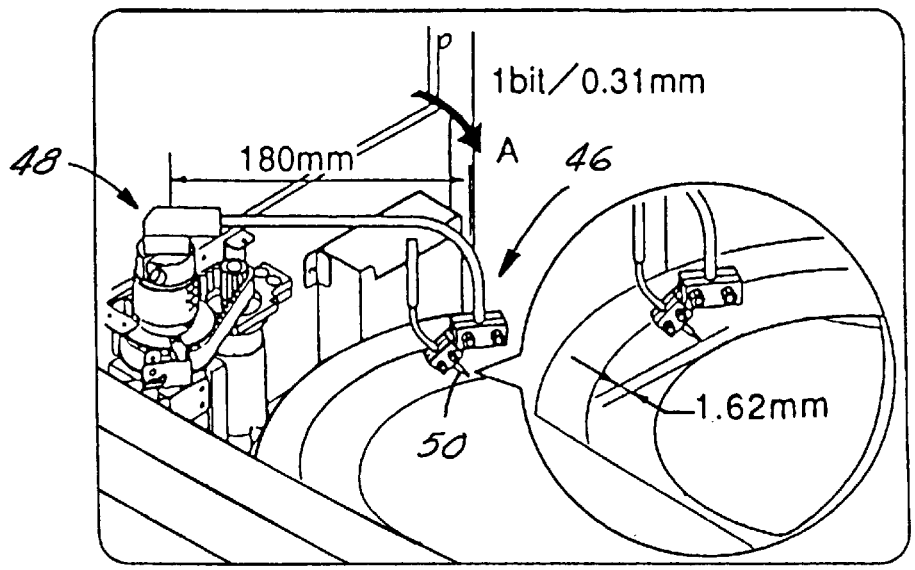
FIG. 5 is a perspective view of a conventional edge bead rinsing apparatus for washing away a photoresist material at an edge of a wafer.
Figure 6:
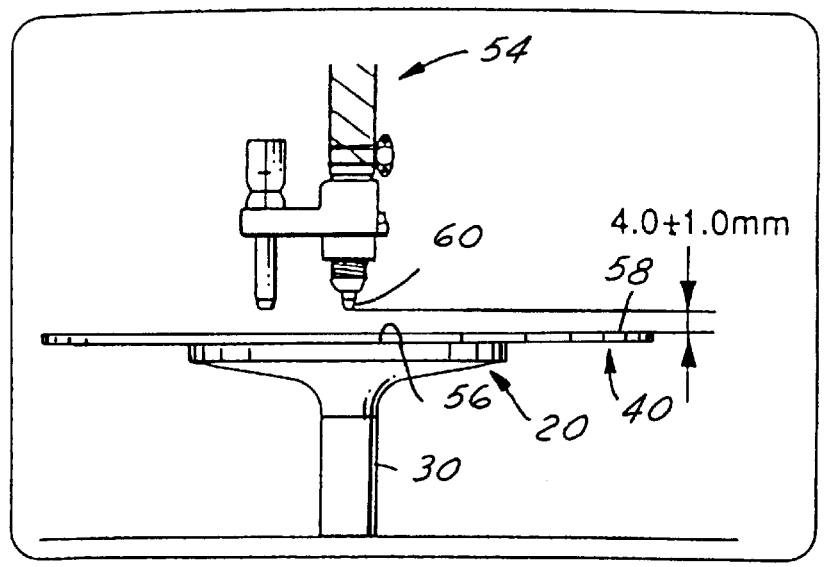
FIG. 6 is a side view of a conventional apparatus for dispensing a liquid on the top surface of a rotating wafer from a liquid dispensing head.
Figure 7:
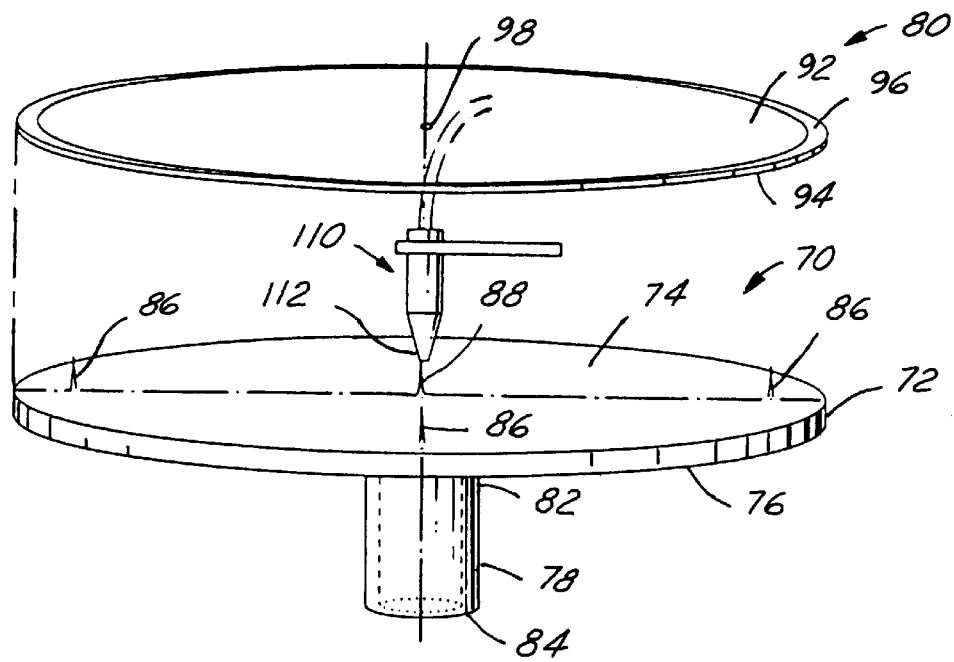
FIG. 7 is a perspective view of the present invention wafer centering chuck and the wafer calibration disk.

Referring now to FIG. 7, where it is shown a wafer centering chuck 70 and a wafer calibration disk 80. The wafer centering chuck 70 is constructed of a circular disk 72 which has a top surface 74 and a bottom surface 76 that are parallel to each other. The wafer centering chuck 70 further includes a hollow-centered shaft 78 which is unitarily connected at one end 82 to a center of the bottom surface 76 of the circular disk 72, while adapted for connecting at the other end 84 to a motor shaft for rotational motion.

The circular disk 72 of the wafer centering chuck 70 further includes a plurality of, such as 5, pins 86, 88 which protrudes from the top surface 74 of the disk 72. The plurality of pins includes a center pin 88 situated at a center of the circular disk 72 and at least three, or preferably four, peripheral pins 86 which are situated along a periphery of the circular disk 72 equally spaced radially from the center pin 88 and circumferentially from each other.

The wafer calibration disk 80 has a shape that is substantially the shape of a wafer that it is used to calibrate, e.g., an 8 inch wafer. The disk 80 further has a diameter that is slightly larger, i.e., at least 0.1 mm larger, than a wafer that it is used to calibrate. The disk 80 further has a top surface 92 and a bottom surface 94. The wafer calibration disk 80 has an edge bead portion 96 that protrudes from the top surface 92 of the disk. The edge bead portion 96 has a width that is substantially similar to a width of a photoresist coating edge bead that is to be removed from a process wafer. For instance, for an 8 inch wafer, the edge bead width is approximately 1.62 mm. The width is different for different sized wafers. The wafer calibration disk 80 further has an aperture 98 provided at the center of the disk for alignment with the center pin 88 on the wafer centering chuck 70 when the disk 80 is positioned on top of the chuck 70 and supported by the plurality of the peripheral pins 86. It should be noted that, while three peripheral pins 86 would be sufficient to support a calibration disk in a stable manner, four or more pins may be more desirable in providing a stable positioning of the wafer calibration disk 80.

Figure 8:
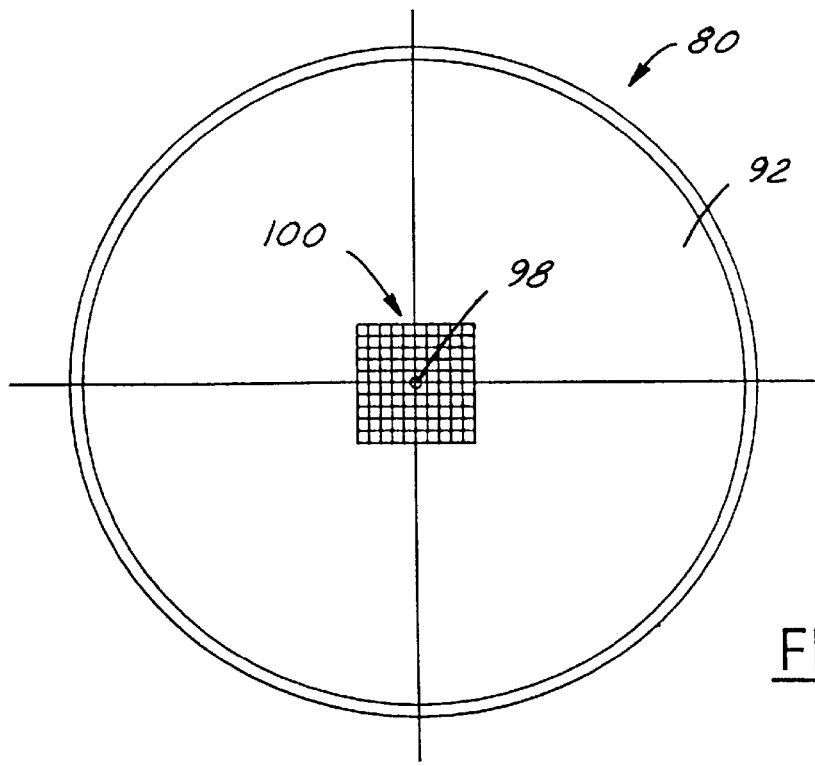
FIG. 8 is a plane view of the wafer calibration disk showing the center aperture and the calibration grid.

FIG. 8 shows a plane view of the wafer calibration disk 80 which may be fabricated of an optically transparent material such as glass, quartz or rigid clear plastics. As shown in FIG. 8, around the center aperture 98 of the disk 80, a calibration grid, or measuring grid 100 is provided. The calibration grid can be divided by grid lines that are 0.5 mm apart, or at any other suitable distances as long as it can be read by either human eyes or an optical device. The wafer calibration disk 80 should be advantageously fabricated of an optically transparent material such that, when positioned on top of a wafer chuck 70, the location of the center pin 88 can be easily recognized and further, the proper supporting by the peripheral pins 86 may also be ensured.

IMPLEMENTATION EXAMPLES

In the first implementation example, the proper positioning of a wafer onto a vacuum chuck from a main arm, a robotic arm, in a WAFER-TRACK® machine can be demonstrated. First, a conventional vacuum chuck in a processing station is manually removed by hand. The present invention wafer centering chuck is then positioned on the motor shaft in place of the conventional vacuum chuck. The WAFER-TRACK® machine is then activated to deliver a wafer to the processing station that is equipped with the wafer centering chuck. Instead of a regular wafer, the present invention novel wafer calibration disk is positioned on the main arm. After the main arm delivers the wafer calibration disk onto the wafer centering chuck and withdraws, the proper centering of the wafer calibration disk in relation to the wafer centering chuck can be visually examined. If the center locating pin 88 on the wafer centering chuck can be seen through the center aperture (which is normally provided in a dimension of about 0.5 mm diameter), the main arm of the WAFER-TRACK® machine has been calibrated properly. However, if the center locating pin 88 is not visible in the center aperture 98, the grid 100 provided on the wafer calibration disk 80 can be used to measure the distance between the locating pin and the center aperture. A set of digital inputs can then be fed into the process machine computer to adjust the robot motion of the main arm. The present invention novel apparatus therefore provides a direct method of calibration by utilizing a visible (readable) reference for such calibration. Such a direct calibration method was never available in the conventional techniques.

In the second implementation example, the calibration of an edge bead rinse nozzle can be performed by the edge bead 96 provided on the wafer calibration disk 80. In this example, the use on the wafer centering chuck 70 is not necessary. As long as the main arm of the WAFER-TRACK® machine has already been calibrated, the wafer calibration disk 80 can be properly positioned onto a conventional vacuum chuck. The edge bead portion 96 on the disk 80 is then used to property locate the starting position and the ending position of the edge bead rinse nozzle. The conventional method of trial and error is therefore not necessary when the present invention novel method is used.

In the third implementation example, the centering of a liquid dispensing nozzle 110, shown in FIG. 7, is illustrated. In this example, only the use of the wafer centering chuck 70 is necessary and the use of the wafer calibration disk 80 is not required. After the wafer centering chuck 70 is used to replace a conventional vacuum chuck in a process station for dispensing either a photoresist liquid or a developing solution, the position of the liquid dispensing head 112 is calibrated according to the center locating pin 88 on the wafer centering chuck 70. A set of digital data is then fed into the process control computer for the proper centering or positioning of the liquid dispensing head 10 in future liquid dispensing operations. The conventional method of trial and error by determining coating thickness or observing void formation is thus completely eliminated. It should be noted that, while the dispensing of a photoresist coating liquid or a photoresist developing liquid is used to illustrate the present invention novel apparatus, the wafer centering chuck can be used to calibrate any liquid dispensing devices that may be used for dispensing any type of liquid material.

While the present invention has been described in an illustrative manner, it should be understood that the terminology used is intended to be in a nature of words of description rather than of limitation.

Furthermore, while the present invention has been described in terms of a preferred embodiment and two alternate embodiments, it is to be appreciated that those skilled in the art will readily apply these teachings to other possible variations of the inventions.

The embodiment of the invention in which an exclusive property or privilege is claimed are defined as follows:

I claim:

1. A wafer centering chuck for centering a wafer processing machine comprising:

a circular disk having two parallel surfaces of a top surface and a bottom surface, a hollow-centered shaft unitarily connected at one end to a center of said bottom surface of said circular disk and adapted for connecting at the other end to a motor means, and a plurality of pins protruding from said top surface of said circular disk, said plurality of pins comprises a center pin situated at a center of said circular disk and at least three peripheral pins situated along a periphery of said circular disk equally spaced radially from said center pin and circumferentially from each other.

2. A wafer centering chuck for centering a wafer processing machine according to claim 1 further comprising:

a wafer calibration disk having a shape substantially that of a wafer, a diameter of at least 0.1 mm larger than a wafer that it is used to calibrate, a top surface and a bottom surface, an edge bead portion protruding from said top surface of the wafer calibration disk having a width substantially similar to a width of a photoresist coating edge bead to be removed from a processed wafer, and an aperture at the center of the wafer calibration disk for alignment with the center pin on the wafer centering chuck when the calibration disk is positioned on top of the centering chuck and supported by the at least three peripheral pins.

3. A wafer centering chuck for centering a wafer processing machine according to claim 2, wherein said calibration disk is used to calibrate a spray nozzle head for removing a photoresist coating edge bead from the surface of a photoresist coated wafer.

4. A wafer centering chuck for centering a wafer processing machine according to claim 2, wherein said wafer calibration disk is fabricated of a material that is substantially transparent.

5. A wafer centering chuck for centering a wafer processing machine according to claim 2, wherein said wafer calibration disk further comprises a grid pattern at the center aperture for measuring deviations from said center.

6. A wafer centering chuck for centering a wafer processing machine according to claim 1, wherein each of said plurality of pins has a sharp-pointed tip.

7. A wafer centering chuck for centering a wafer processing machine according to claim 1, wherein said plurality of pins are five pins comprises one center pin and four peripheral pins.

8. A wafer centering chuck for centering a wafer processing machine according to claim 1, wherein said centering chuck is used to calibrate the centering of a liquid dispense nozzle for dispensing a liquid on a rotating wafer.

9. A wafer centering chuck for centering a wafer processing machine according to claim 1, wherein said centering chuck is used to calibrate the centering of a photoresist liquid dispense nozzle for dispensing a photoresist coating on a rotating wafer.

10. A wafer centering chuck for centering a wafer processing machine according to claim 5, wherein said wafer calibration disk is used in calibrating a wafer loading device by loading said calibration disk on said wafer centering chuck and measuring a deviation between said aperture on the calibration disk and said center pin on the centering chuck.

11. A wafer centering chuck for centering a wafer processing machine according to claim 10, wherein said wafer loading device is a belt-driven loader for a photoresist coating/developing/edge bead rinsing apparatus.

12. A wafer centering device for centering a wafer processing machine comprising:
 a wafer centering chuck having two parallel surfaces of a top surface and a bottom surface,
 a hollow-centered shaft unitarily connected at one end to a center of said bottom surface of said centering chuck and adapted for connecting at the other end to a motor means,
 a plurality of pins protruding from said top surface of said centering chuck, said plurality of pins comprises a center pin situated at a center of said centering chuck and at least three peripheral pins situated along a periphery of said centering chuck equally spaced radially from said center pin and circumferentially from each other,
 a wafer calibration disk having a shape substantially that of a wafer, a diameter at least 0.1 mm larger than a wafer that it is used to calibrate, a top surface and a bottom surface, an edge bead portion protruding from said top surface of the wafer calibration disk having a width substantially similar to a width of a photoresist coating edge bead to be removed from a processed wafer, and
 an aperture at the center of the calibration disk for alignment with the center pin on the centering chuck when the calibration disk is positioned on top of the centering chuck and supported by the at least three peripheral pins.

13. A wafer centering device for centering a wafer processing machine according to claim 12, wherein said wafer calibration disk is fabricated of a material that is substantially transparent.

14. A wafer centering device for centering a wafer processing machine according to claim 12, wherein said wafer calibration disk further comprises a grid pattern at the center aperture for measuring deviations from said center.

15. A wafer centering device for centering a wafer processing machine according to claim 12, wherein said calibration disk is used to calibrate a spray nozzle head for removing a photoresist coating edge bead front the surface of a photoresist coated wafer.

16. A wafer centering device for centering a wafer processing machine according to claim 12, wherein said centering chuck is used to calibrate the centering of a liquid dispensing nozzle for dispensing a liquid on a rotating wafer.

17. A wafer centering device for centering a wafer processing machine according to claim 12, wherein said wafer calibration disk is used in calibrating a wafer loading device by loading said calibration disk on said wafer centering chuck and measuring a deviation between said aperture on the calibration disk and said center pin on the centering chuck.

18. A method for calibrating a wafer loading robot to accurately loading a wafer onto a rotatable wafer platform comprising the steps of:
 providing a wafer centering chuck having a top surface parallel to a bottom surface, a hollow-centered shaft unitarily connected at one end to a center of said bottom surface and adapted for connecting at the other end to a motor means, a plurality of pins protruding from said top surface comprise a center locating pin at a center of said top surface and at least three support pins along a periphery of said top surface equally spaced from said center locating pin and circumferentially from each other,
 removing a rotatable wafer platform from a motor shaft,
 mounting said wafer centering chuck to said motor shaft,
 providing a wafer calibration disk having a wafer shape, a top surface and a bottom surface, an edge bead portion protruding from said top surface of the calibration disk and an aperture and a measuring grid at the center of the calibration disk,
 loading said wafer calibration disk onto said wafer centering chuck by said wafer loading robot such that said disk being supported by said at least three support pins, and
 measuring a distance between the center locating pin on said wafer centering chuck and the center aperture in said wafer calibration disk by said measuring grid provided on the calibration disk.

19. A method for calibrating a wafer loading robot to accurately loading a wafer onto a rotatable wafer platform according to claim 18 further comprising the steps of:
 providing a width of said edge bead portion on said calibration disk substantially the same as the width of a photoresist coating edge bead to be removed on a processed wafer, and
 calibrating a spray nozzle head for removing said photoresist coating edge bead to the width of said edge bead portion on said calibration disk.

20. A method for calibrating a wafer loading robot to accurately loading a wafer onto a rotatable wafer platform according to claim 18 further comprising the steps of:
 providing a liquid dispensing head, and
 calibrating a center of said liquid dispensing head to said center locating pin on said wafer centering chuck.

21. A method for calibrating a wafer loading robot to accurately loading a wafer onto a rotatable wafer platform according to claim 18, wherein said wafer calibration disk is fabricated of a material that is substantially transparent.

22. A method for calibrating a wafer loading robot to accurately loading a wafer onto a rotatable wafer platform according to claim 18, wherein said plurality of pins are five pins comprises one center pin and four peripheral pins.

23. A method for calibrating a wafer loading robot to accurately loading a wafer onto a rotatable wafer platform according to claim 18, wherein said wafer loading robot is a belt-driven wafer loader for a photoresist coating/developing/edge bead rinsing apparatus.

24. A method for calibrating a wafer loading robot to accurately loading a wafer onto a rotatable wafer platform according to claim 18, wherein said measuring arid provided at the center of the calibration disk has a dimension of about 0.5 mm/grid.

* * * * *